(12) United States Patent
Chang et al.

(10) Patent No.: US 10,321,600 B2
(45) Date of Patent: Jun. 11, 2019

(54) MODULARIZED SERVER

(71) Applicant: QUANTA COMPUTER INC., Taoyuan (TW)

(72) Inventors: Hou-Hsien Chang, Taoyuan (TW); Chao-Jung Chen, Taoyuan (TW); Yaw-Tzorng Tsorng, Taoyuan (TW); Po-Chen Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 101 days.

(21) Appl. No.: 15/425,722

(22) Filed: Feb. 6, 2017

(65) Prior Publication Data

US 2018/0063985 A1    Mar. 1, 2018

(30) Foreign Application Priority Data

Aug. 25, 2016 (TW) .............................. 105127209 A

(51) Int. Cl.
*H05K 7/14* (2006.01)
*H05K 7/18* (2006.01)

(52) U.S. Cl.
CPC ......... *H05K 7/1489* (2013.01); *H05K 7/1455* (2013.01); *H05K 7/1487* (2013.01); *H05K 7/1492* (2013.01); *H05K 7/183* (2013.01)

(58) Field of Classification Search
CPC .... H05K 7/1489; H05K 7/1455; H05K 7/183; H05K 7/1487; H05K 7/1492
USPC .... 361/727, 679.43, 679.31, 679.39, 679.58, 361/679.02
See application file for complete search history.

(56) References Cited

U.S. PATENT DOCUMENTS

| | | | | |
|---|---|---|---|---|
| 5,928,016 A | * | 7/1999 | Anderson | H05K 7/1411 361/801 |
| 6,288,902 B1 | * | 9/2001 | Kim | G11B 33/08 206/701 |
| 7,204,371 B2 | * | 4/2007 | Woolsey | H05K 7/1455 211/26 |
| 9,743,547 B1 | * | 8/2017 | Amin-Shahidi | G06F 1/181 |

* cited by examiner

*Primary Examiner* — Rockshana D Chowdhury
(74) *Attorney, Agent, or Firm* — Nixon Peabody LLP; Eduardo J. Quiñones; Zhou Lu

(57) ABSTRACT

A modularized server comprises a rack, a switching mechanism, and a removable electronic device. The rack comprises a first slot and a second slot. The switching mechanism is disposed on the rack. When the removable electronic device is inserted into the first slot, the removable electronic device is operable to drive the switching mechanism to a switching position. The switching mechanism at the switching position can stop another removable electronic device different from a specific design of the removable electronic device from being inserted into the second slot.

10 Claims, 13 Drawing Sheets

MODULARIZED SERVER

CROSS-REFERENCE TO RELATED APPLICATION

This application claims priority to Taiwan Application Number 105127209, entitled, "MODULARIZED SERVER" and filed on Aug. 25, 2016, the disclosure of which is incorporated herein by reference in its entirety.

FIELD OF THE TECHNOLOGY

The present technology mainly relates to a server, and more particularly to a modularized server.

BACKGROUND

To facilitate rapid repairing and updating of a server such as a network server or database, a modularization function is designed in the server. When the server fails, the repairing of the server is accelerated by merely replacing the damaged module in the server. When the server is to be upgraded, the upgrading can be done rapidly by replacing the related module in the server.

Accordingly, to save the fabrication cost of a modularized server, each module is designed with the same casing, and modules of different designs may be inserted into the same server. However, when the modules of different designs are inserted into a server, damages may be caused to the server.

SUMMARY OF THE PRESENT TECHNOLOGY

To avoid the defects in the prior art, the present technology provides a modularized server, to prevent a user from inserting, into the server, an electronic device that does not meet the specification of the server, thereby avoiding damages to the server.

The present technology provides a modularized server, including: a rack, a switching mechanism, and a first removable electronic device. The rack includes a first slot and a second slot. The switching mechanism includes a switching element, a first stopping block, a second stopping block, an elastic element, a first casing, and a first limiting element. The switching element is movably disposed on the rack. The first stopping block is disposed on the switching element, and extends into the first slot.

The second stopping block is disposed on the switching element, and extends into the second slot. The elastic element is disposed on the rack and the switching element, and is used for providing an elastic force to maintain the switching element, the first stopping block, and the second stopping block at an initial position. The first removable electronic device is inserted into the first slot, and includes a first casing and a first limiting element disposed on the first casing.

When the first removable electronic device is inserted into the first slot and the first limiting element is disposed at a first marked position on the first casing, the first limiting element is operable to push the first stopping block, such that the switching element, the first stopping block, and the second stopping block move to a first switching position.

When the first removable electronic device is inserted into the first slot and the first limiting element is disposed at a second marked position on the first casing, the first limiting element is operable to push the first stopping block, such that the switching element, the first stopping block, and the second stopping block move to a second switching position.

In some examples, the modularized server further includes a second removable electronic device. The second removable electronic device includes a second casing and a second limiting element disposed on the second casing. When the second stopping block is located at the first switching position and the second limiting element is located at a first marked position on the second casing, the switching mechanism is operable to allow the second removable electronic device to be inserted into the second slot. When the second stopping block is located at the first switching position and the second limiting element is located at a second marked position on the second casing, the second stopping block is operable to stop the second removable electronic device from being inserted into the second slot.

When the second stopping block is located at the second switching position and the second limiting element is located at a second marked position on the second casing, the switching mechanism is operable to allow the second removable electronic device to be inserted into the second slot. When the second stopping block is located at the second switching position and the second limiting element is located at a first marked position on the second casing, the second stopping block is operable to stop the second removable electronic device from being inserted into the second slot.

In some examples, the structure and size of the first casing are identical to or substantially identical to the structure of the second casing, and the structure and size of the first limiting element are identical to or substantially similar to that of the second limiting element.

In some examples, when the first removable electronic device is detached from the first slot, the elastic element is operable to restore the switching element, the first stopping block, and the second stopping block to an initial position.

In some examples, the first casing includes a sliding groove, and the rack includes a sliding rail extending in a guide direction. When the first removable electronic device is inserted into the first slot, the sliding rail is located in the sliding groove, and is operable to guide the first removable electronic device to move in the guide direction.

In some examples, the first casing includes an accommodating groove extending in a guide direction, and the first limiting element is located in the accommodating groove and extends in the guide direction. When the first removable electronic device is inserted into the first slot, the first casing is operable to move in the guide direction, and the first stopping block is located in the accommodating groove.

In some examples, the first limiting element includes an inclined surface located at one end of the first limiting element and a side surface connected to the inclined surface, the inclined surface tilts relative to the side surface, and the side surface extends in a guide direction. When the first removable electronic device is inserted into the first slot, the inclined surface is operable to push the first stopping block to move from the initial position to the first switching position, and the first stopping block is operable to slide along the inclined surface to the side surface.

In some examples, the rack further includes a top plate, and the top plate includes a first through-hole and a second through-hole, the switching element is located on the top plate, the first stopping block is operable to pass through the first through-hole to reach the first slot, and the second stopping block is operable to pass through the second through-hole to reach the second slot.

In some examples, the elastic element is a spring, and two ends of the elastic element are respectively fixed on the top plate and the switching element.

In some examples, the rack includes a spacer plate disposed between the first slot and the second slot.

In some examples, the modularized server further includes a main electrical connector located in the first slot, the first removable electronic device further includes an electrical connector disposed on the first casing, and when the first removable electronic device is inserted into the first slot, the electrical connector is operable to be inserted into the main electrical connector.

In view of the above, according to the modularized server of the present technology, the switching mechanism is used to stop removable electronic devices of different specifications from being mounted in the modularized server, thereby avoiding damages to the modularized server due to certain wrong operations by a user.

DETAILED DESCRIPTION OF THE PRESENT TECHNOLOGY

Figure 1:
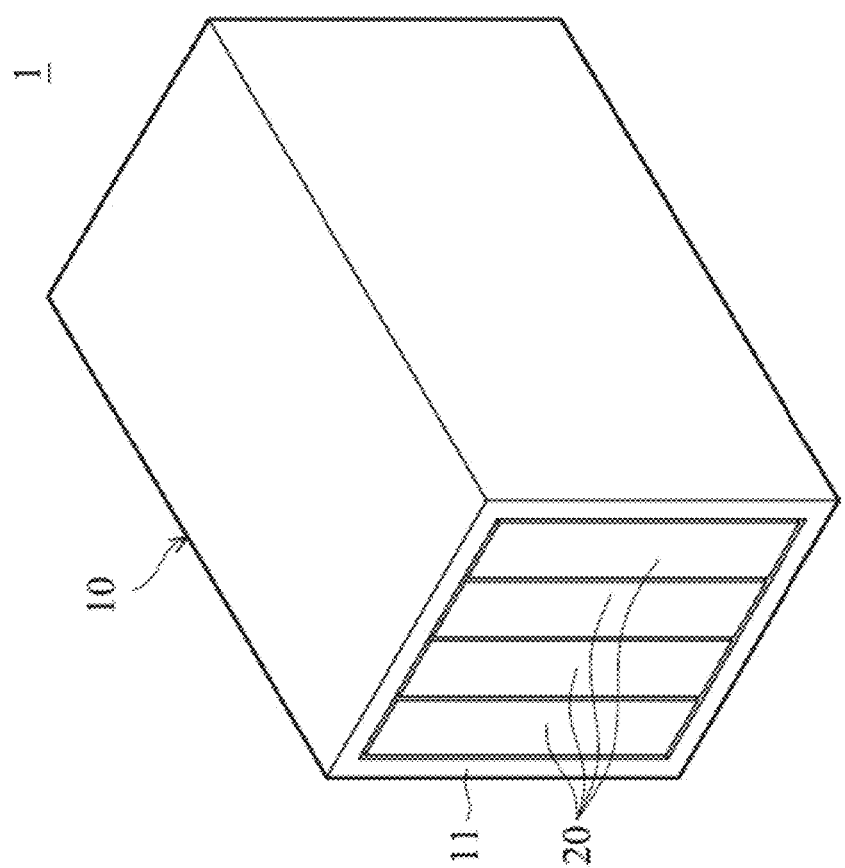
FIG. 1 illustrates a three-dimensional view of a modularized server according some examples of the present technology.

Different examples or examples are provided in the following description to implement different features of the present technology. The elements and arrangements described in the specific examples below are merely used as examples to briefly illustrate the present technology, instead of limiting the present technology. For example, the description of a structure with a first feature being on or above a second feature includes the circumstances that the first feature and the second feature are in direct contact, or another feature is disposed between the first feature and the second feature such that the first feature and the second feature are not in direct contact.

Besides, the same reference numerals and/or characters are used in the different examples of this specification, which is for simplified and explicit description only and does not indicate that different examples and settings are necessarily associated.

The terms like "first" and "second" in this specification are merely for clear explanation, and do not correspond to or limit the scope of the present technology. Moreover, the terms like "first feature" and "second feature" do not restrict that the first feature and the second feature are identical or different features.

The related spatial terms, for example, "above" or "below", are merely used to briefly describe the relationship of an element or a feature relative to another element or feature in the figures. In addition to the directions described in the figures, devices may be used or operated in different directions.

The shape, size, thickness, and inclined angle in the figures may not be depicted in proportion or may be simplified for clear description, and are provided for illustration only.

FIG. 1 illustrates a three-dimensional view of a modularized server 1 according to the present technology. The modularized server 1 may be a network server, a database, or a computer. The modularized server 1 includes a host 10 and multiple removable electronic devices 20. The removable electronic devices 20 are inserted into the host 10.

The removable electronic device 20 may be a network device, a storage device, or a processing device. The network device may include electronic elements such as a network processing chip, a memory, and a circuit board, for processing network data. The storage device may include a hard disk drive for storing, collecting, and reading data. The processing device may include electronic elements such as a central processing chip, a memory, and a main circuit board, for performing various operations.

For example, in this example, the modularized server 1 may be a network server, and the removable electronic devices 20 may each be a network device.

When one of the removable electronic devices 20 fails, the repairing of the modularized server 1 is accelerated by merely replacing the damaged removable electronic device 20. When the modularized server 1 is to be upgraded, the upgrading can be done rapidly by replacing the removable electronic devices 20.

Figure 2:
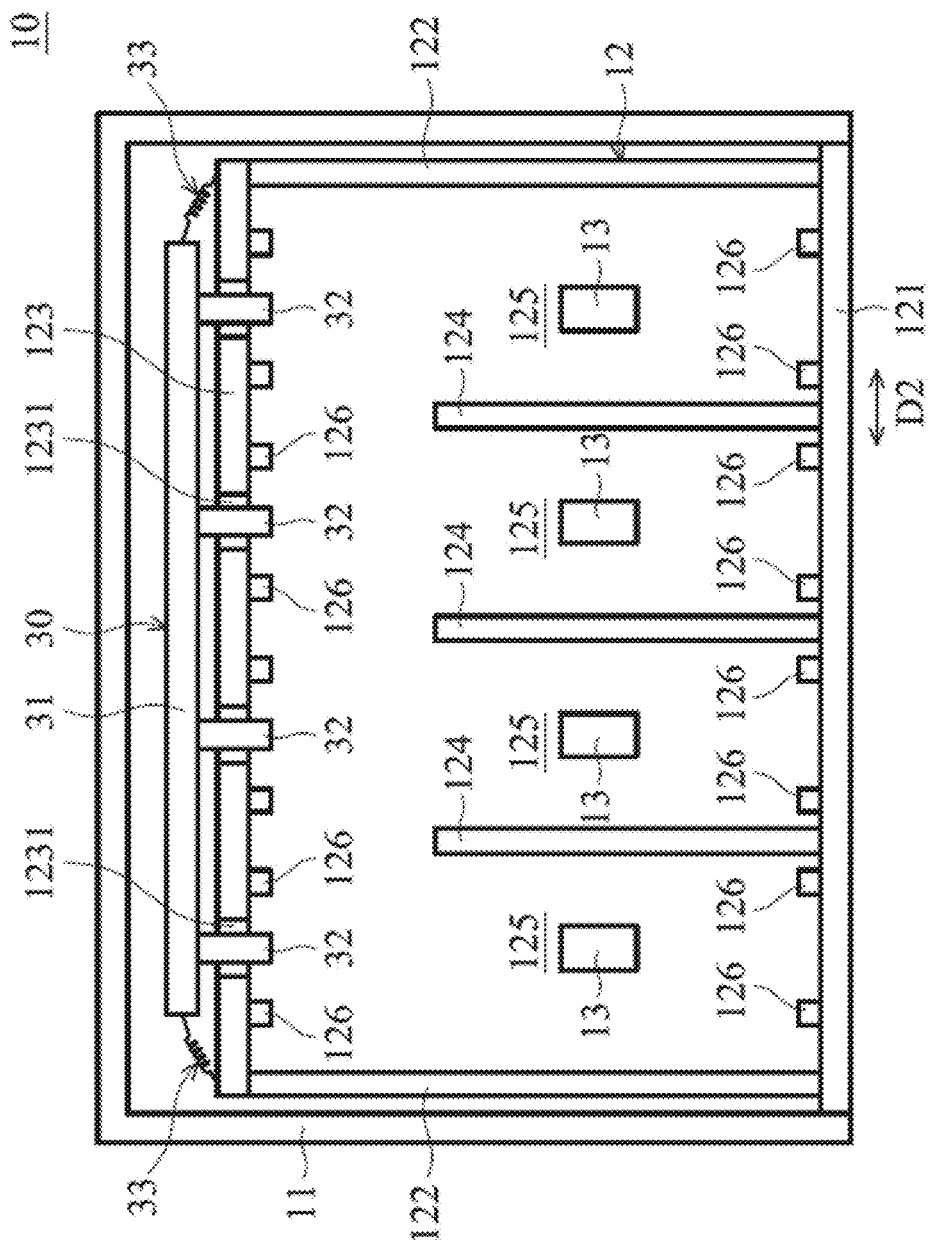
FIG. 2 illustrates a front view of a host according some examples of the present technology.
Figure 3:
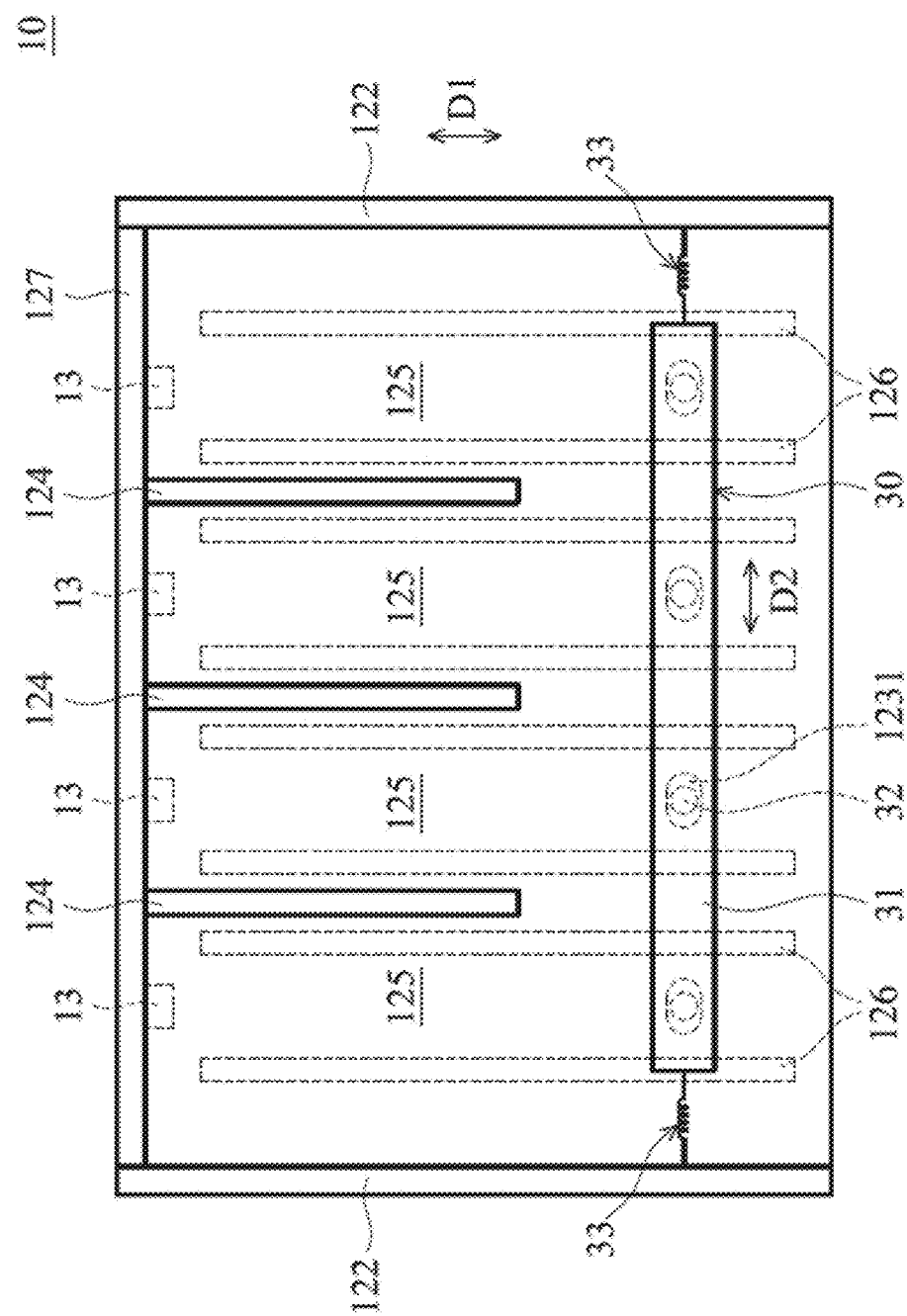
FIG. 3 illustrates a top view of the host according some examples of the present technology.

FIG. 2 illustrates a front view of the host 10 according to the present technology, FIG. 3 illustrates a top view of the host 10 according to the present technology, and a housing 11 is not depicted in FIG. 2. The host 10 includes a housing 11, a rack 12, and multiple main electrical connectors 13. The housing 11 may be a metal casing, for protecting electronic elements in the housing 11. The rack 12 is disposed in the housing 11, and the removable electronic devices 20 are mounted on the rack 12.

In this example, the rack 12 includes a bottom plate 121, multiple side walls 122, a top plate 123, multiple spacer plates 124, a mounting plate 127, and multiple sliding rails 126. The bottom plate 121 and the top plate 123 are spaced from each other, and the bottom plate 121 and the top plate 123 may be substantially in parallel. The side walls 122 are connected to the bottom plate 121 and the side walls 122.

Every two side walls 122 are spaced from each other, and may be substantially in parallel.

In this example, the spacer plates 124 may be fixedly or detachably disposed on the bottom plate 121. The spacer plates 124 are respectively located between every two side walls 122, and may be substantially in parallel with the side walls 122. As shown in FIG. 2 and FIG. 3, multiple slots 125 may be formed between the spacer plates 124 and the side walls 122 and between the spacer plates 124. In other words, the spacer plates 124 are respectively located between every two adjacent slots 125. The spacer plates 124 may be used to restrict the positions of the removable electronic devices 20 inserted in the rack 12.

The sliding rails 126 are disposed on the top plate 123 and the bottom plate 121. The sliding rails 126 may be of a strip-shaped structure, and extend in a guide direction D1 (as shown in FIG. 3). Each slot 125 has more than one sliding rail 126 therein. In this example, each slot 125 has four sliding rails 126, where two of the sliding rails 126 are disposed on the top plate 123, and the other two are disposed on the bottom plate 121.

The mounting plate 127 is located between the bottom plate 121 and the top plate 123, and may be substantially perpendicular to the bottom plate 121 and the top plate 123. In some examples, the mounting plate 127 may be mounted on the side walls 122, to increase the stability of the mounting plate 127.

The main electrical connectors 13 may be disposed on the mounting plate 127. In some examples, the main electrical connectors 13 may pass through the mounting plate 127. In some examples, the mounting plate 127 may be a circuit board, and the main electrical connectors 13 are electrically connected to the mounting plate 127.

In this example, each slot 125 may have one main electrical connector 13, and the main electrical connector 13 in each slot 125 may be disposed at the same position and have the same specification and size. In some examples, each slot 125 may have multiple main electrical connectors 13. The main electrical connectors 13 in each slot 125 may have different specifications and sizes.

As shown in FIG. 2 and FIG. 3, the modularized server 1 further includes a switching mechanism 30. The switching mechanism 30 is disposed on the rack 12. The switching mechanism 30 includes a switching element 31, multiple stopping blocks 32, and an elastic element 33. The switching element 31 is movably disposed on the top plate 123 of the rack 12. The switching element 31 may be of a strip-shaped plate structure, and extends in a switching direction D2. The switching direction D2 may be perpendicular to or substantially perpendicular to the guide direction D1.

The stopping blocks 32 are disposed on the switching element 31. In this example, the stopping blocks 32 are arranged on the switching element 31 at intervals, and the stopping blocks 32 may be directly fixed on the switching element 31. The top plate 123 has multiple through-holes 1231. The stopping blocks 32 respectively pass through the through-holes 1231, and extend into the slots 125. In this example, the stopping blocks 32 may extend perpendicular to the switching direction D2.

The elastic element 33 is disposed on the rack 12 and the switching element 31. In some examples, the elastic element 33 is a spring. Two ends of each elastic element 33 are respectively fixed on the top plate 123 and the switching element 31, and two elastic elements 33 are respectively fixed on two ends of the switching element 31. Therefore, the two elastic elements 33 may provide an elastic force to maintain the switching element 31 and the stopping blocks 32 at an initial position shown in FIG. 2 and FIG. 3.

As shown in FIG. 2 and FIG. 3, in the switching direction D2, each stopping block 32 may be located at the center of the corresponding through-hole 1231, and the through-hole 1231 extends in the switching direction D2. Therefore, the through-holes 1231 may restrict the switching element 31 and the stopping blocks 32 to move in the switching direction D2.

Figure 4:
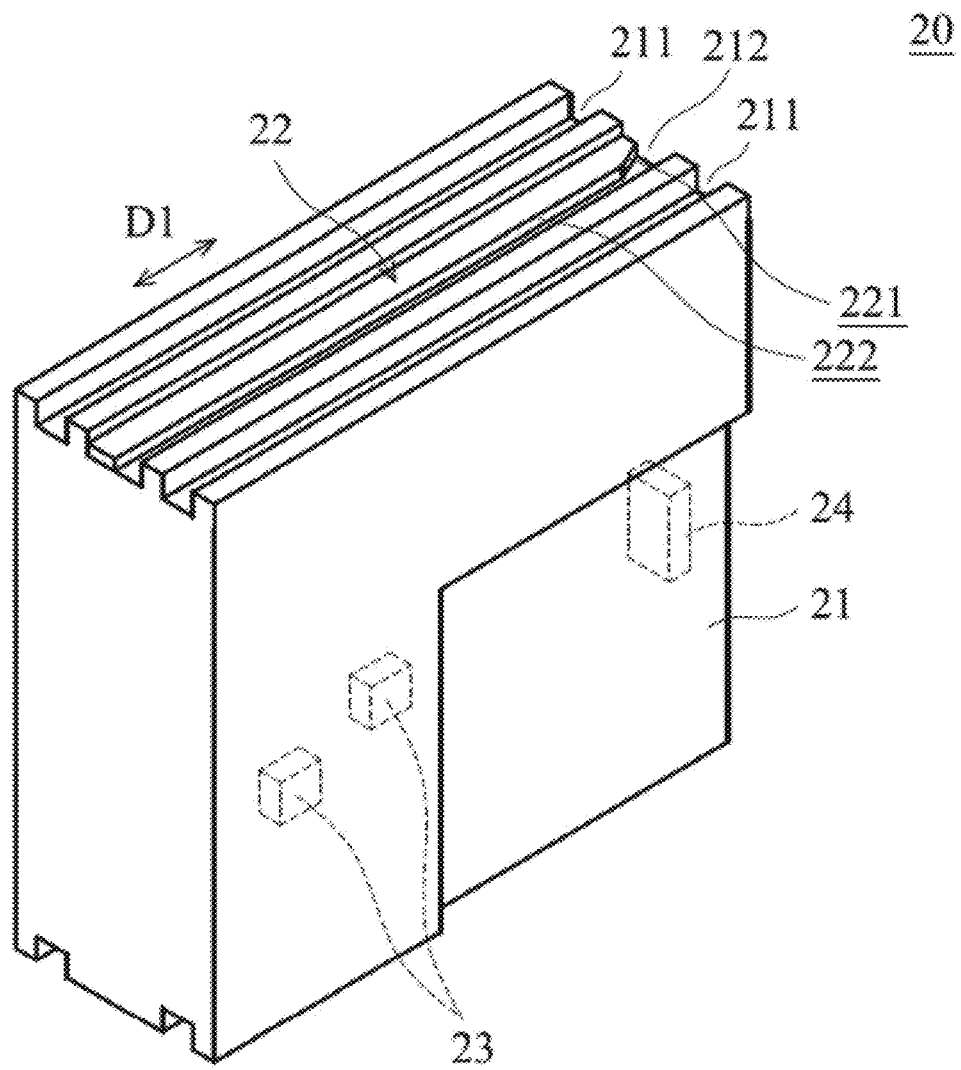
FIG. 4 illustrates a three-dimensional view of a removable electronic device according to the present technology.
Figure 5:
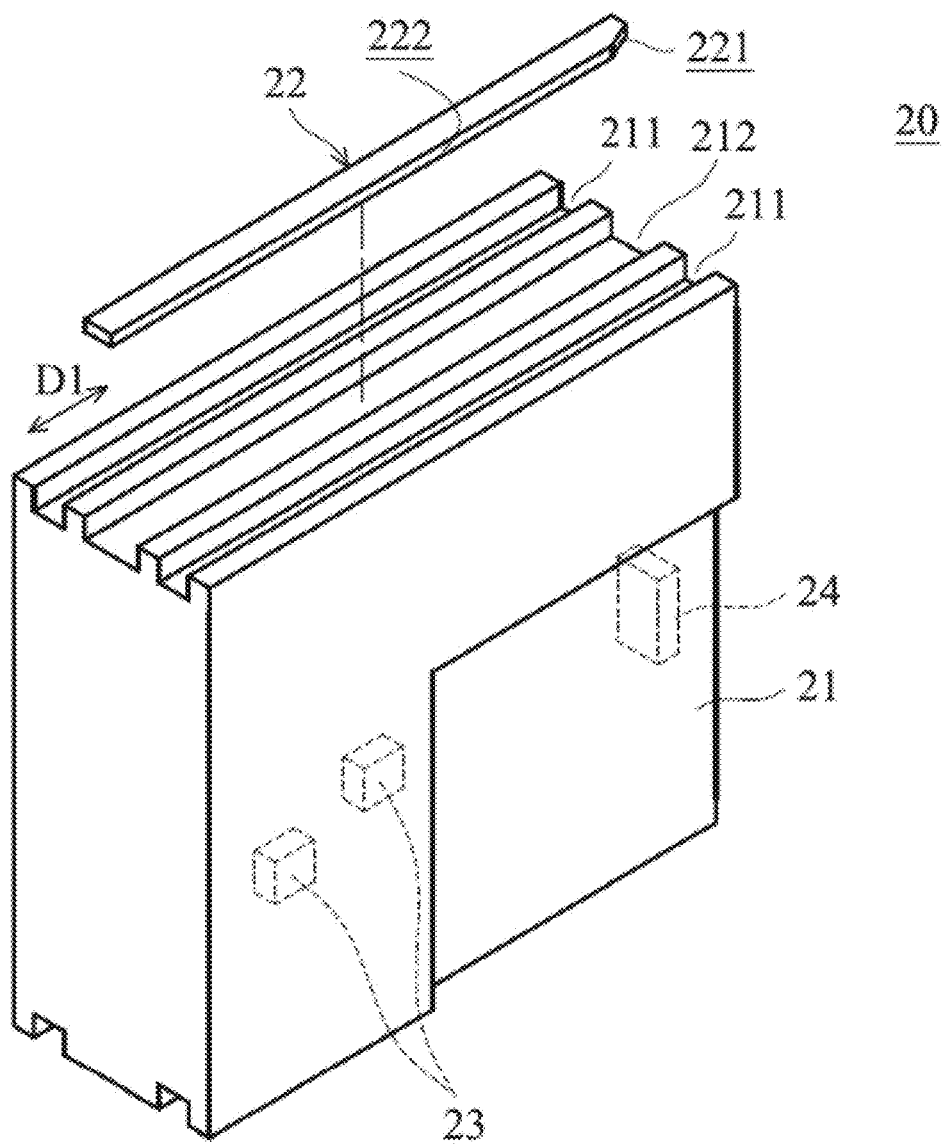
FIG. 5 illustrates an exploded view of the removable electronic device according some examples of the present technology.

FIG. 4 illustrates a three-dimensional view of the removable electronic device 20 according to the present technology. FIG. 5 illustrates an exploded view of the removable electronic device 20 according to the present technology. The removable electronic device 20 is inserted into the slot 125. The removable electronic device 20 includes a casing 21, a limiting element 22, multiple electronic elements 23, and an electrical connector 24.

The casing 21 has multiple sliding grooves 211 and an accommodating groove 212. The sliding grooves 211 are located on the top and bottom of the casing 21. In this example, two sliding grooves 211 are located on the top of the casing 21, and two sliding grooves 211 are located on the bottom of the casing 21. The accommodating groove 212 is located between the two sliding grooves 211 on the top of the casing 21. The sliding grooves 211 and the accommodating groove 212 may extend in the guide direction D1. In other words, the sliding grooves 211 and the accommodating groove 212 are in parallel to each other.

The limiting element 22 is disposed on the casing 21. In this example, the limiting element 22 is located in the accommodating groove 212. The limiting element 22 may be a strip-shaped plate structure, and extends in the guide direction D1. The width of the limiting element 22 is larger than that of the accommodating groove 212. In this example, the width of the limiting element 22 is approximately twice that of the accommodating groove 212. The width of the limiting element 22 and the width of the accommodating groove 212 are measured in a direction perpendicular to the guide direction D1.

In some examples, the limiting element 22 is detachably disposed on the casing 21. For example, the limiting element 22 may be disposed on the casing 21 in a buckled or locked manner. Besides, the limiting element 22 is selectively disposed at a first marked position or a second marked position in the accommodating groove 212. As shown in FIG. 4, the limiting element 22 is located at a first marked position in the accommodating groove 212.

The electronic elements 23 are disposed in the casing 21. The electrical connector 24 is disposed on the rear side of the casing 21, and is electrically connected to the electronic elements 23. In some examples, the removable electronic device 20 may include multiple electrical connectors 24. The number and position of the electrical connector 24 correspond to the number and position of the main electrical connector 13 in each slot 125.

Figure 6A:
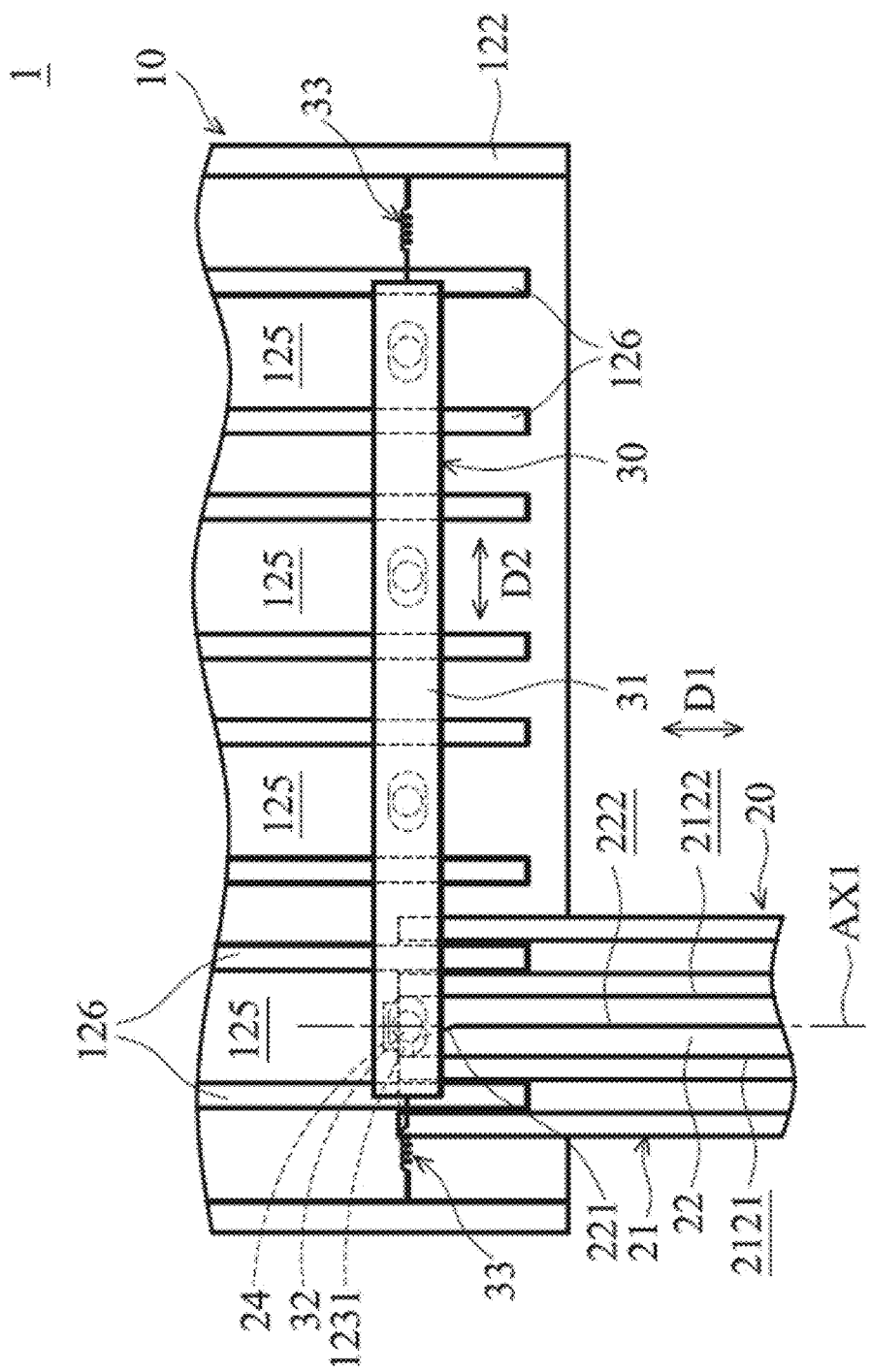
FIG. 6A illustrates a schematic view of the modularized server at a middle stage of a mounting step according some examples of the present technology.

FIG. 6A to FIG. 6D illustrate schematic views of the modularized server 1 at a middle stage of a mounting step according to the present technology. As shown in FIG. 6A, the removable electronic device 20 is to be inserted into the slot 125 in a guide direction D1.

The limiting element 22 has an inclined surface 221 and a side surface 222. The inclined surface 221 is located at one end of the limiting element 22, and tilts relative to the side surface 222. When the removable electronic device 20 is inserted into the slot 125 in the guide direction D1, the end of the limiting element 22 where the inclined surface 221 is located faces the mounting plate 127 or the slot 125.

The side surface 222 is connected to the inclined surface 221, and extends in the guide direction D1. As shown in FIG. 6A, the limiting element 22 is located at the first marked position in the accommodating groove 212 at the moment. The first marked position is located at the left half of the accommodating groove 212 in FIG. 6A. The limiting element 22 contacts or is adjacent to a first side wall 2121 of the accommodating groove 212, and is away from a second side wall 2122 of the accommodating groove 212.

The limiting element 22 is detachably disposed at the second marked position in the accommodating groove 212. When the limiting element 22 is disposed at the second marked position, the limiting element 22 turns by 180°, that is, turns by 180° about a longitudinal axis AX1 extending in the guide direction D1. In some examples, the longitudinal axis AX1 is located at the center of the accommodating groove 212 in the longitudinal direction. The second marked position is located at the right half of the accommodating groove 212 in FIG. 6A. The limiting element 22 contacts or is adjacent to the second side wall 2122 of the accommodating groove 212, and is away from the first side wall 2121 of the accommodating groove 212.

In some examples, the limiting element 22 at the first marked position is located between the longitudinal axis AX1 and the first side wall 2121. The limiting element 22 at the second marked position is located between the longitudinal axis AX1 and the second side wall 2122.

In FIG. 6A, since the switching element 31 does not push the stopping block 32, the switching mechanism 30 is located at the initial position. In some examples, the stopping block 32 is located on the longitudinal axis AX1.

Figure 6B:
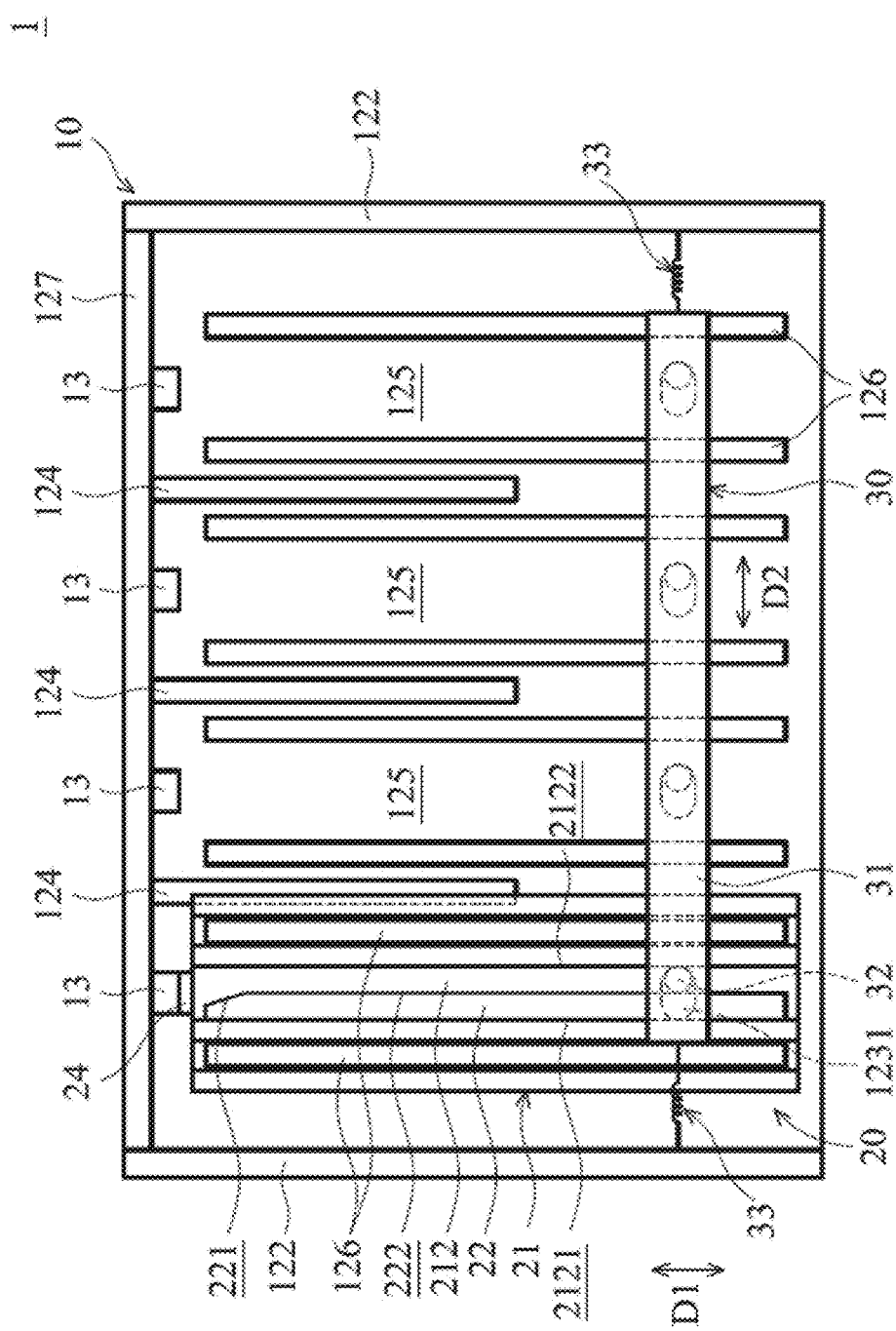
FIG. 6B illustrates a schematic view of the modularized server at a middle stage of a mounting step according some examples of the present technology.

In FIG. 6B, when the removable electronic device 20 continuously moves in the guide direction D1, the inclined surface 221 pushes the stopping block 32 to move from the initial position to the first switching position, and the stopping block 32 slides along the inclined surface 221 to the side surface 222.

As shown in FIG. 6B, the diameter of the stopping block 32 is approximately equal to the width of the limiting element 22, and is approximately half of the width of the accommodating groove 212. The above diameter and width are measured in the switching direction D2. Therefore, the stopping block 32 may move to a position between the second side wall 2122 of the accommodating groove 212 and the limiting element 22.

Besides, when the removable electronic device 20 is inserted into the slot 125, the sliding rail 126 is located in the sliding groove 211, and restricts the removable electronic device 20 to move in the guide direction D1. The casing 21 moves in the guide direction D1, and the stopping block 32 is located in the accommodating groove 212. When the removable electronic device 20 is inserted into the slot 125, the electrical connector 24 is inserted into the main electrical connector 13.

In this example, since the stopping block 32 moves to the first switching position, the switching element 31 and the remaining stopping blocks 32 move to the second switching position.

Figure 6C:
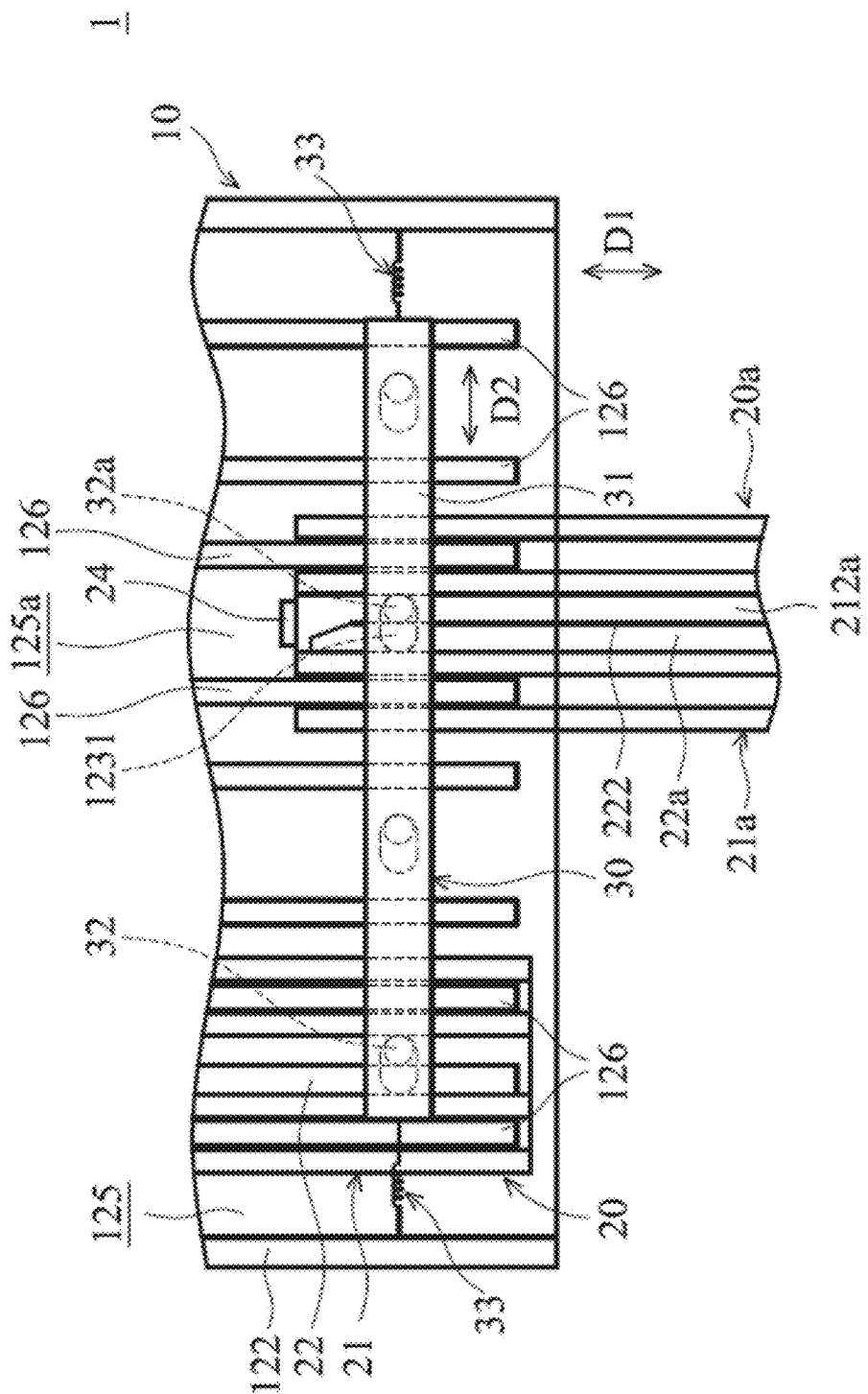
FIG. 6C illustrates a schematic view of the modularized server at a middle stage of a mounting step according some examples of the present technology.

As shown in FIG. 6C, another removable electronic device 20a is inserted into the slot 125a. The removable electronic device 20a includes a casing 21a and a limiting element 22a. The limiting element 22a is disposed on the casing 21a. The structure and size of the casing 21 are identical to or substantially identical to the structure of the casing 21a, and the structure and size of the limiting element 22 are identical to or substantially identical to that of the limiting element 22a.

As shown in FIG. 6C, the stopping block 32a is located at the first switching position, the limiting element 22a is located at a first marked position of the casing 21a, and the switching mechanism 30 allows the removable electronic device 20a to be inserted into the slot 125a.

Figure 6D:
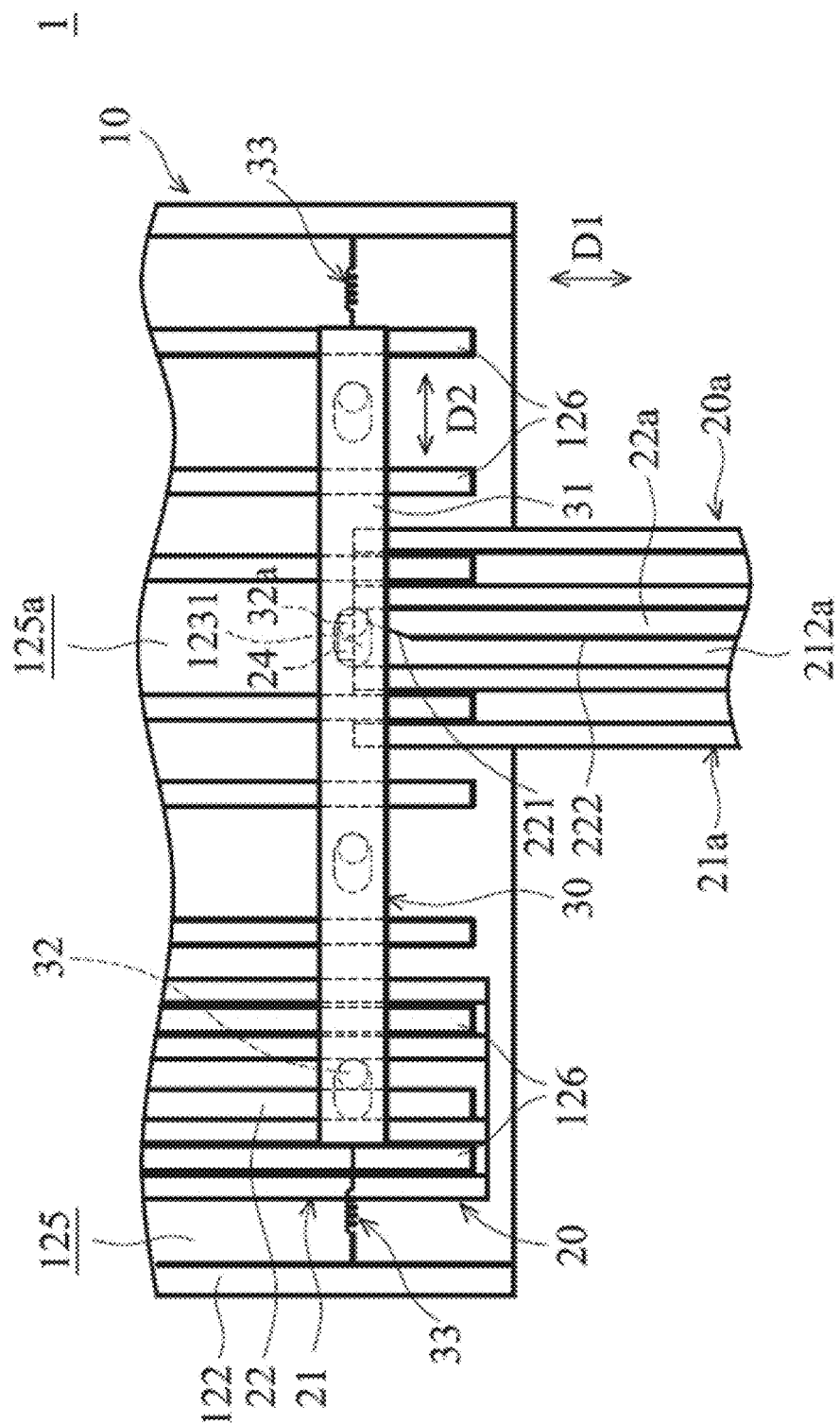
FIG. 6D illustrates a schematic view of the modularized server at a middle stage of a mounting step according some examples of the present technology.

As shown in FIG. 6D, the stopping block 32a is located at the first switching position, the limiting element 22a is located at a second marked position on the casing 21a, and the stopping block 32a stops the removable electronic device 20a from being inserted into the slot 125a.

By inserting the removable electronic device 20 into the slot 125, the switching mechanism 30 moves to the first switching position. Therefore, the switching mechanism 30 only allows the removable electronic device 20a having the limiting element 22a located at the first marked position to be inserted into the slot 125a. When the limiting element 22a of the removable electronic device 20a is located at the second marked position different from the first marked position, the switching mechanism 30 stops the removable electronic device 20a from being inserted into the slot 125a, to prevent the removable electronic device 20a that does not meet the specification from being inserted into the slot 125a. Therefore, the modularized server 1 has a foolproof function, to avoid damages to the modularized server 1 due to misoperation of a user.

Moreover, when the removable electronic device 20 is detached from the slot 125, the elastic element 33 restores the switching element 31 and the stopping block 32 to the initial position (as shown in FIG. 6A).

Figure 7A:
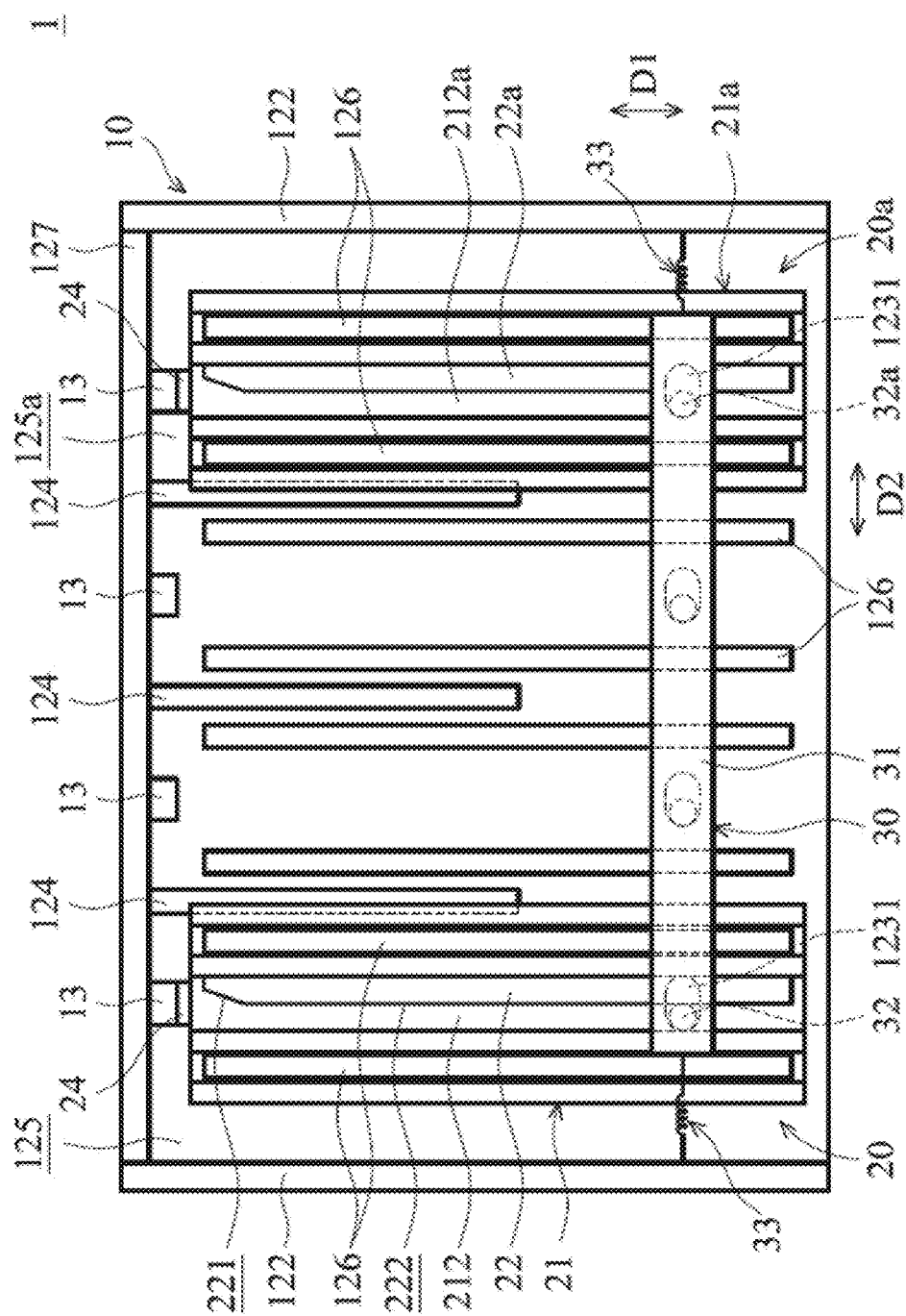
FIG. 7A illustrates a schematic view of the modularized server at a middle stage of a mounting step according some examples of the present technology.
Figure 7B:
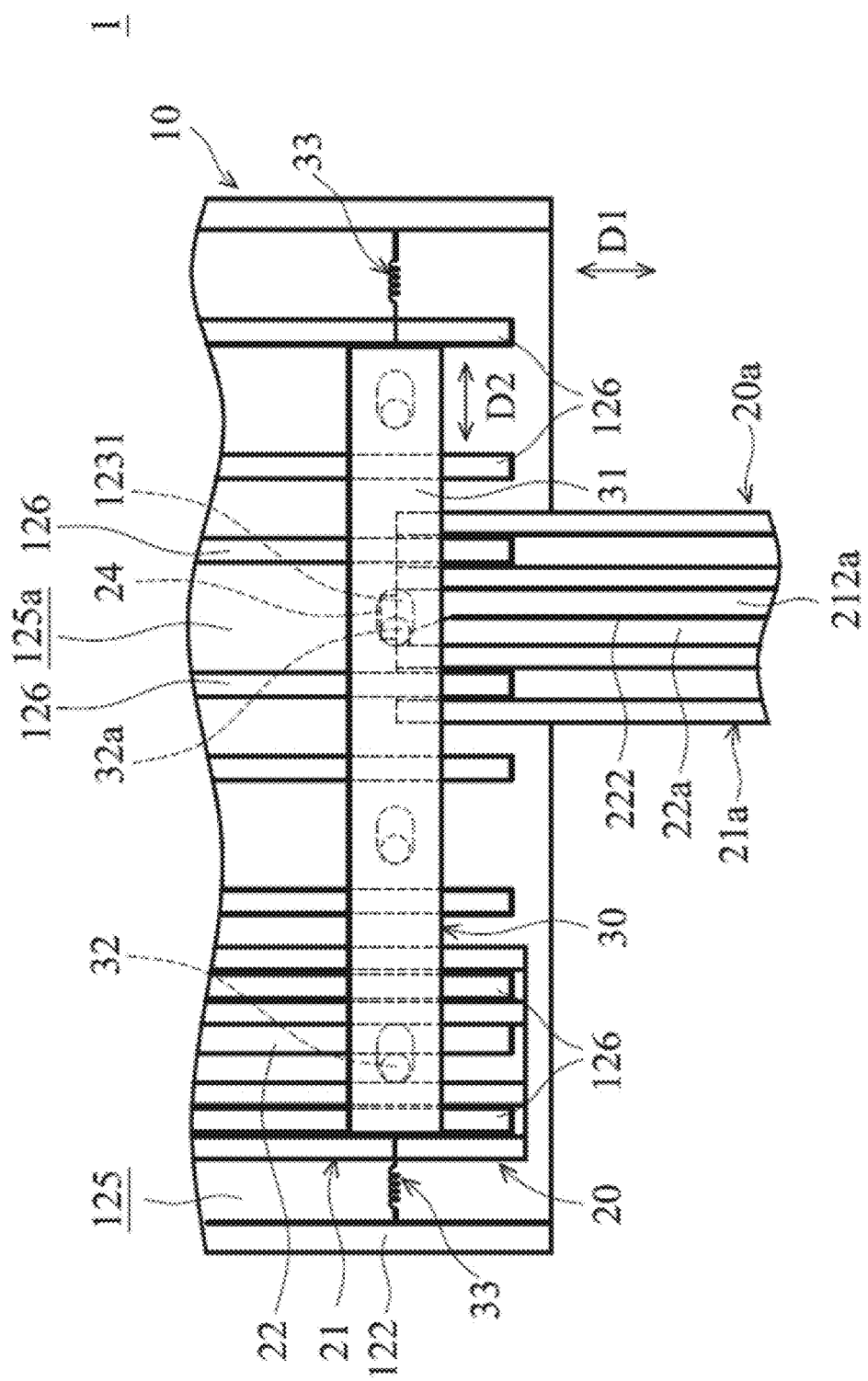
FIG. 7B illustrates a schematic view of the modularized server at a middle stage of a mounting step according some examples of the present technology.

FIG. 7A and FIG. 7B illustrate schematic views of the modularized server 1 at a middle stage of a mounting step according to the present technology. As shown in FIG. 7A, the removable electronic device 20 is inserted into the slot 125, and the limiting element 22 is disposed at the second marked position on the casing 21. The second marked position is located at the right half of the accommodating groove 212 in FIG. 7A. The limiting element 22 pushes the stopping block 32, such that the switching element 31, the stopping block 32, and the stopping block 32a move to a second switching position.

The limiting element 22a of the removable electronic device 20a is located at the second marked position on the casing 21a, and the switching mechanism 30 allows the removable electronic device 20a to be inserted into the slot 125a.

As shown in FIG. 7B, the removable electronic device 20 is inserted into the slot 125, and the limiting element 22 is disposed at the second marked position on the casing 21. The limiting element 22a of the removable electronic device 20a is located at the first marked position on the casing 21a, and the switching mechanism 30 stops the removable electronic device 20a from being inserted into the slot 125a.

By inserting the removable electronic device 20 into the slot 125, the switching mechanism 30 moves to the second switching position. Therefore, the switching mechanism 30 only allows the removable electronic device 20a having the limiting element 22a located at the second marked position to be inserted into the slot 125a. When the limiting element 22a of the removable electronic device 20a is located at the first marked position different from the second marked position, the switching mechanism 30 stops the removable electronic device 20a from being inserted into the slot 125a, to prevent the removable electronic device 20a that does not meet the specification from being inserted into the slot 125a. Therefore, the modularized server 1 has a foolproof function, to avoid damages to the modularized server 1 due to wrong operation by a user.

In view of the above, according to the modularized server of the present technology, the switching mechanism is used to stop removable electronic devices of different specifications from being mounted in the modularized server, thereby avoiding damages to the modularized server due to wrong operation by a user.

Figure 7C:
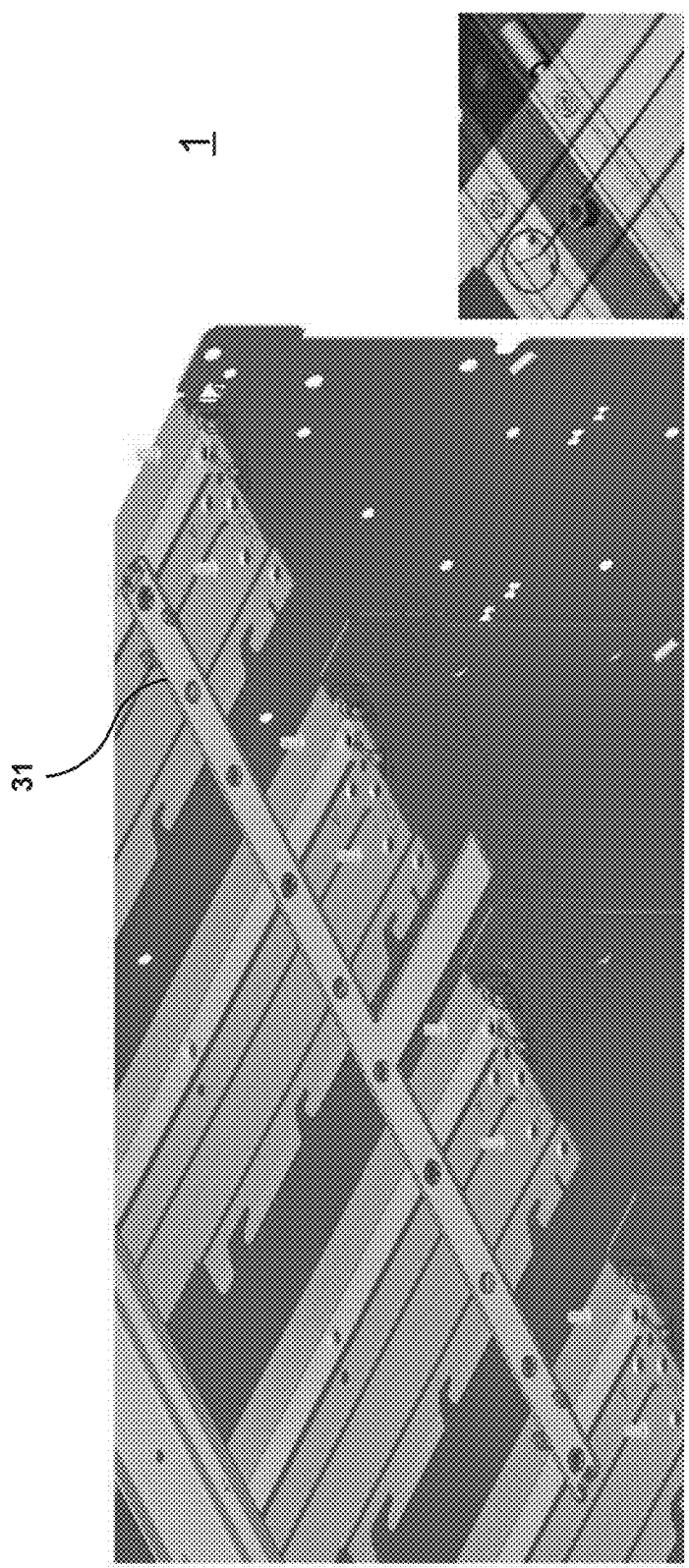
FIG. 7C illustrates a schematic view of the modularized server at a middle stage of a mounting step according some examples of the present technology.
Figure 7D:
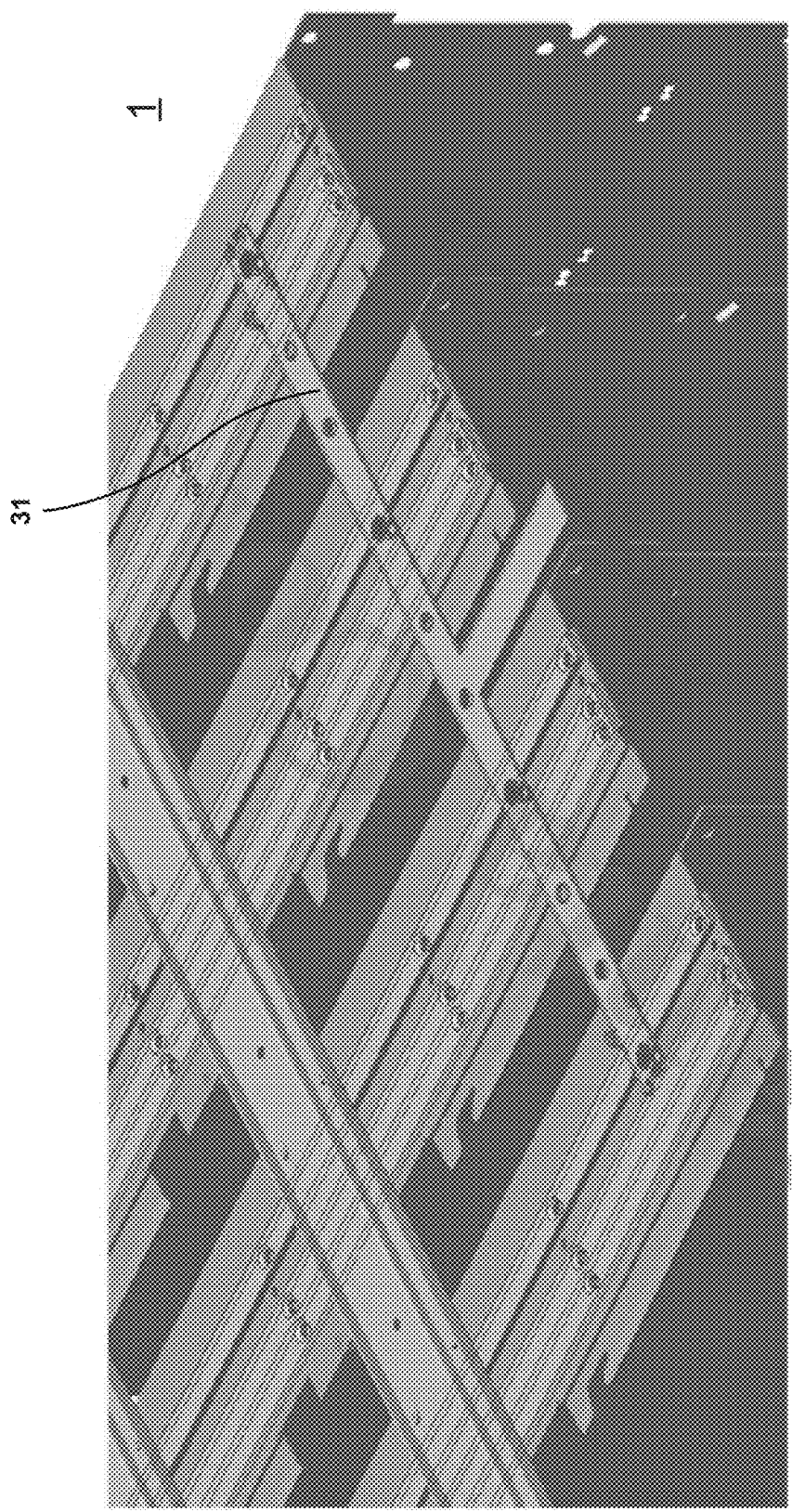
FIG. 7D illustrates a schematic view of the modularized server at a middle stage of a mounting step according some examples of the present technology.

FIG. 7C and FIG. 7D illustrate schematic views of exemplary modularized server 1 at a middle stage of a mounting step according to the present technology. In FIG. 7C, the switching element 31 can be controlled manually without the elastic element 33 illustrated in FIGS. 7A and 7B. In FIG. 7D, the switching element 31 can be used to switch between two or more types of removable electronic device 20. For example, the switching element 31 can allow types A and B removable electronic devices 20 to be inserted when a limiting element is disposed at a first position, and allow types C and D removable electronic devices 20 to be inserted when the limiting element is disposed at a second position.

Although the present technology is illustrated above through the examples, these examples are merely used as examples for reference instead of limiting the scope of the present technology. Persons skilled in the art can make some modifications and variations without departing from the spirit and scope of the present technology. Therefore, the above examples are not intended to limit the scope of the present technology, and the protection scope of the present technology is defined by the appended claims.

What is claimed is:

1. A modularized server, comprising:
   a rack, comprising a bottom plate, side walls, a top plate, a first slot and a second slot;
   a switching mechanism, comprising:
      only one switching element, disposed on the rack and being movable in a switching direction;
      a first stopping block, disposed on the only one switching element, and extending into the first slot;
      a second stopping block, disposed on the only one switching element, and extending into the second slot; and
      two elastic elements, disposed on the rack and fixed on two ends of the only one switching element, a first end of each of the two elastic elements fixed on the top plate and a second end of the two elastic elements fixed to the only one switching element near the side walls, for providing an elastic force to maintain the only one switching element, the first stopping block, and the second stopping block at an initial position;
   wherein the first slot is operable to receive a first removable electronic device, the first removable electronic device comprising:
   a first casing, the first casing including a sliding groove, and the rack including a sliding rail extending in a guide direction; and
   a first limiting element, disposed on the first casing;
   wherein, when the first removable electronic device is inserted into the first slot in the guide direction and the first limiting element is disposed at a first marked position on the first casing, insertion of the first removable electronic device causes the first limiting element to push the first stopping block, such that the only one switching element, the first stopping block, and the second stopping block move to a first switching position, wherein the switching direction is substantially perpendicular to the guide direction;
   wherein, when the first removable electronic device is inserted into the first slot and the first limiting element is disposed at a second marked position on the first casing, insertion of the first removable electronic device causes the first limiting element to push the first stopping block, such that the only one switching element, the first stopping block, and the second stopping block move to a second switching position,
   wherein the first switching position and the second switching position are different.

2. The modularized server according to claim 1, wherein the second slot is operable to receive a second removable electronic device, the second removable electronic device comprising:
   a second casing; and
   a second limiting element, disposed on the second casing,
   wherein, when the second stopping block is located at the first switching position and the second limiting element is located at a first marked position on the second casing, the switching mechanism is operable to allow the second removable electronic device to be inserted into the second slot,
   wherein, when the second stopping block is located at the first switching position and the second limiting element is located at a second marked position on the second casing, the second stopping block is operable to stop the second removable electronic device from being inserted into the second slot.

3. The modularized server according to claim 2, wherein, when the second stopping block is located at the second switching position and the second limiting element is located at the second marked position on the second casing, the switching mechanism is operable to allow the second removable electronic device to be inserted into the second slot,
   wherein, when the second stopping block is located at the second switching position and the second limiting element is located at a first marked position on the second casing, the second stopping block is operable to stop the second removable electronic device from being inserted into the second slot.

4. The modularized server according to claim 2, wherein a structure and size of the first casing is substantially similar to a structure and size of the second casing, and a structure and size of the first limiting element is substantially similar to a structure and size of the second limiting element.

5. The modularized server according to claim 1, wherein, when the first removable electronic device is detached from the first slot, the two elastic elements are operable to restore each of the only one switching element, the first stopping block, and the second stopping block to an initial position.

6. The modularized server according to claim 1, wherein, when the first removable electronic device is inserted into the first slot, the sliding rail is located in the sliding groove and is operable to guide the first removable electronic device to move in the guide direction.

7. The modularized server according to claim 1, wherein the first casing comprises an accommodating groove extending in the guide direction, wherein the first limiting element is located in the accommodating groove and extends in the guide direction, and wherein, when the first removable electronic device is inserted into the first slot, the first casing is operable to move in the guide direction and the first stopping block is located in the accommodating groove.

8. The modularized server according to claim 1, wherein the first limiting element comprises an inclined surface located at one end of the first limiting element and a side surface connected to the inclined surface, wherein the inclined surface tilts relative to the side surface, and wherein the side surface extends in the guide direction; wherein, when the first removable electronic device is inserted into the first slot, the inclined surface is operable to push the first stopping block to move from an initial position of the first stopping block to the first switching position, and the first stopping block is operable to slide along the inclined surface to the side surface.

9. The modularized server according to claim 1, wherein the rack further comprises a top plate, wherein the top plate comprises a first through-hole and a second through-hole, wherein the only one switching element is located on the top plate, wherein the first stopping block is operable to pass through the first through-hole to reach the first slot, and wherein the second stopping block is operable to pass through the second through-hole to reach the second slot.

10. The modularized server according to claim 1, further comprising a main electrical connector located in the first slot, wherein the first removable electronic device further comprises an electrical connector disposed on the first casing, and wherein, when the first removable electronic device is inserted into the first slot, the electrical connector is operable to be inserted into the main electrical connector.

* * * * *